(12) United States Patent
Cheng et al.

(10) Patent No.: US 8,227,311 B2
(45) Date of Patent: Jul. 24, 2012

(54) METHOD OF FORMING ENHANCED CAPACITANCE TRENCH CAPACITOR

(75) Inventors: Kangguo Cheng, Guilderland, NY (US); Byeong Y. Kim, Lagrangeville, NY (US); Munir D. Naeem, Poughkeepsie, NY (US); James P. Norum, Holmes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/900,095

(22) Filed: Oct. 7, 2010

(65) Prior Publication Data
US 2012/0086064 A1  Apr. 12, 2012

(51) Int. Cl.
*H01L 21/8242* (2006.01)
(52) U.S. Cl. .................... 438/243; 257/E21.008
(58) Field of Classification Search .................... None
See application file for complete search history.

(56) References Cited

U.S. PATENT DOCUMENTS

| | | | |
|---|---|---|---|
| 5,662,768 A * | 9/1997 | Rostoker | ............... 257/301 |
| 6,025,225 A | 2/2000 | Forbes et al. | |
| 6,037,620 A | 3/2000 | Hoenigschmid et al. | |
| 6,153,474 A | 11/2000 | Ho et al. | |
| 6,171,872 B1 | 1/2001 | Lowrey et al. | |
| 6,177,696 B1 | 1/2001 | Bronner et al. | |
| 6,190,988 B1 | 2/2001 | Furukawa et al. | |
| 6,200,873 B1 | 3/2001 | Schrems et al. | |
| 6,232,171 B1 | 5/2001 | Mei | |
| 6,271,079 B1 | 8/2001 | Wei et al. | |
| 6,291,289 B2 | 9/2001 | Rhodes et al. | |
| 6,365,485 B1 | 4/2002 | Shiao et al. | |
| 6,391,712 B2 | 5/2002 | Ji | |
| 6,440,792 B1 | 8/2002 | Shiao et al. | |
| 6,555,430 B1 | 4/2003 | Chudzik et al. | |
| 6,566,177 B1 | 5/2003 | Radens et al. | |
| 6,713,341 B2 | 3/2004 | Chen et al. | |
| 6,806,138 B1 | 10/2004 | Cheng et al. | |
| 6,828,191 B1 | 12/2004 | Wurster et al. | |

(Continued)

OTHER PUBLICATIONS

U.S. Appl. No. 12/423,242, filed Apr. 14, 2009 naming inventors Xi Li et al., entitled: "Bottle-Shaped Trench Capacitor with Enhanced Capacitance".

*Primary Examiner* — Seahvosh Nikmanesh
(74) *Attorney, Agent, or Firm* — Joseph P. Abate; Daryl Neff (57) ABSTRACT

A method of fabricating a trench capacitor is provided in which a material composition of a semiconductor region of a substrate varies in a quantity of at least one component therein such that the quantity alternates with depth a plurality of times between at least two different values. For example, a concentration of a dopant or a weight percentage of a second semiconductor material in a semiconductor alloy can alternate between with depth a plurality of times between higher and lower values. In such method, the semiconductor region can be etched in a manner dependent upon the material composition to form a trench having an interior surface which undulates in a direction of depth from the major surface of the semiconductor region. Such method can further include forming a trench capacitor having an undulating capacitor dielectric layer, wherein the undulations of the capacitor dielectric layer are at least partly determined by the undulating interior surface of the trench. Such trench capacitor can provide enhanced capacitance, and can be incorporated in a memory cell such as a dynamic random access memory ("DRAM") cell, for example.

15 Claims, 5 Drawing Sheets

U.S. PATENT DOCUMENTS

| | | |
|---|---|---|
| 6,846,744 B1 | 1/2005 | Chen |
| 6,849,529 B2 | 2/2005 | Lee et al. |
| 6,867,089 B2 | 3/2005 | Chen et al. |
| 6,872,621 B1 | 3/2005 | Wu |
| 6,977,227 B2 | 12/2005 | Lin et al. |
| 6,989,561 B2 | 1/2006 | Lin et al. |
| 7,009,238 B2 | 3/2006 | Lee et al. |
| 7,084,451 B2 | 8/2006 | Forbes et al. |
| 7,101,768 B2 | 9/2006 | Settlemyer, Jr. et al. |
| 7,112,505 B2 | 9/2006 | Wu |
| 7,115,934 B2 | 10/2006 | Cheng et al. |
| 7,122,439 B2 | 10/2006 | Kwon et al. |
| 2003/0052088 A1* | 3/2003 | Khan et al. ............ 216/67 |
| 2006/0228864 A1 | 10/2006 | Chen et al. |

* cited by examiner

METHOD OF FORMING ENHANCED CAPACITANCE TRENCH CAPACITOR

BACKGROUND OF THE INVENTION

1. Field of the Invention

The present invention relates to semiconductor devices and their manufacture, and more specifically to a structure and method of making a semiconductor chip having a trench capacitor.

2. Description of the Related Art

Semiconductor chips are flat thin bodies which have active semiconductor devices, e.g., transistors, formed within a thin active semiconductor region adjacent a major surface of the chip. Certain kinds of semiconductor chips, such as those which incorporate dynamic random access memories ("DRAMs"), include capacitors which are connected with active semiconductor devices to perform electrical functions of the chip. The on-chip capacitors can be trench capacitors which extend in a downward direction below the chip's active semiconductor region. Another type of on-chip capacitors are stack capacitors which are formed in one or more layers disposed above the active semiconductor region. In either case, the particular way the capacitors are provided on the chip can affect the amount of capacitance provided by each capacitor, as well as affect the amount of area of the active semiconductor region that remains available to form the active semiconductor devices.

One of the challenges of fabricating on-chip capacitors is to obtain sufficient capacitance while limiting the amount of area of the active semiconductor device region taken up by the capacitors. Further improvements can be made in the structure and fabrication of on-chip trench capacitors for achieving these or other goals.

SUMMARY OF THE INVENTION

A method of fabricating a trench capacitor is provided in accordance with an aspect of the invention. Such method can include etching a semiconductor region of a substrate, wherein the semiconductor region has a material composition in which the quantity of at least one component therein alternates with depth a plurality of times between at least two different values, and the etching can be performed in a manner dependent upon the material composition to form a trench having an interior surface which undulates with a depth from a major surface of the semiconductor region. Such method can further include forming a trench capacitor having an undulating capacitor dielectric layer, wherein the undulations of the capacitor dielectric layer are at least partly determined by the undulating interior surface of the trench.

In accordance with another aspect of the invention, a method is provided for fabricating a trench capacitor which can include etching a semiconductor region of a substrate, wherein the semiconductor region has a concentration of a dopant therein which alternates with depth a plurality of times between at least two different values. In such method, the etching can be performed in a manner that is dependent upon the dopant concentration to form a trench having an interior surface which undulates with a depth from a major surface of the semiconductor region. Such method can further include forming a trench capacitor having an undulating capacitor dielectric layer, wherein the undulations of the capacitor dielectric layer are at least partly determined by the undulating interior surface of the trench.

In accordance with another aspect of the invention, an integrated circuit is provided which can include a trench capacitor having an undulating capacitor dielectric layer, wherein the undulations of the capacitor dielectric layer are at least partly determined by an undulating interior surface of a trench extending into a semiconductor region of a substrate. In such integrated circuit, the semiconductor region can have a material composition adjacent to the undulating interior surface in which the quantity of at least one component thereof alternates with depth from a major surface of the semiconductor region a plurality of times between at least two different values.

DETAILED DESCRIPTION

Figures 1, 1A, 2:
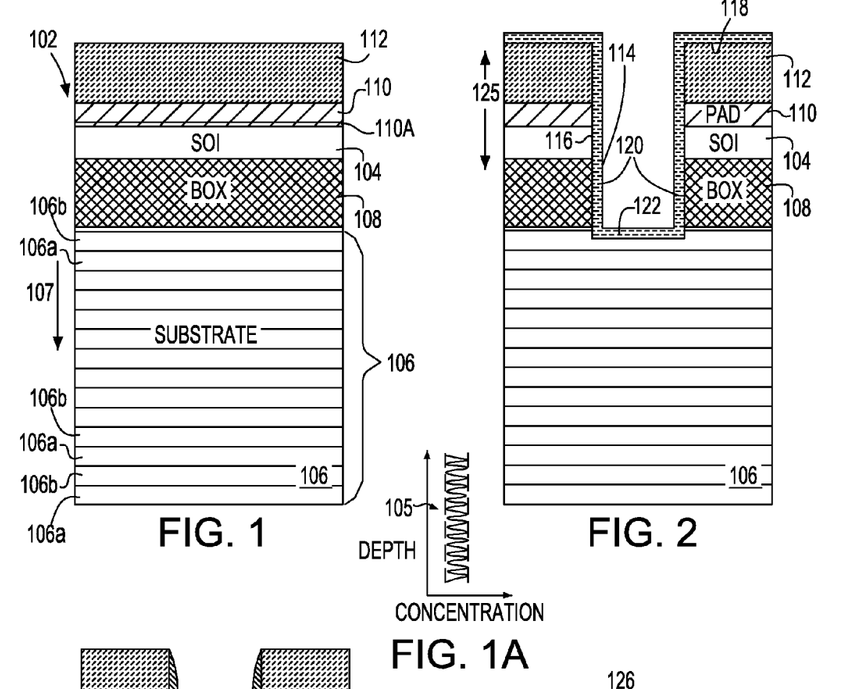
FIG. 1 is a sectional view illustrating a stage in a method of forming an enhanced capacitance trench capacitor in accordance with an embodiment of the invention.
FIG. 1A is a graph illustrating a profile of a dopant concentration in accordance with a depth from a major surface of a semiconductor region in a method of forming an enhanced capacitance trench capacitor.
FIG. 2 is a sectional view illustrating a stage subsequent to the stage of FIG. 1 in a method of forming an enhanced capacitance trench capacitor in accordance with an embodiment of the invention.

FIG. 1 is a sectional view illustrating a stage in a method of forming an enhanced capacitance trench capacitor in accordance with an embodiment of the invention of fabricating a semiconductor chip containing a trench capacitor. As illustrated in FIG. 1, a silicon-on-insulator ("SOI") substrate 102 includes a monocrystalline silicon layer ("SOI layer") 104 separated from a bulk semiconductor region 106 by a buried oxide ("BOX") layer 108. A pad dielectric layer 110 and a hard mask layer 112 can be disposed atop the SOI substrate. The pad dielectric layer 110 typically includes a pad layer of silicon nitride and may also include a pad layer of silicon oxide 110A underlying the pad nitride. The hard mask layer 112 typically includes a silicon oxide layer. As an alternative to silicon, the SOI layer 104 may include other semiconductor materials, including but not limited to, germanium, silicon germanium, a compound semiconductor, such as a semiconductor material formed by a compound of a Group III element with a Group V element (gallium arsenide) or a compound of a Group II element with a Group VI element, or any combination of those materials. The SOI layer 104 may have the same crystalline orientation as the bulk semiconductor region 106 or may have a different crystalline orientation.

As further seen in FIG. 1, the bulk semiconductor region 106 may have a material composition in which the quantity of at least one component therein alternates with depth a plurality of times between at least two different values. The varying material composition is depicted in FIG. 1 as a plurality of layers 106a, 106b which alternate a plurality of times in a direction of a depth 107 from the BOX layer 108. However, the difference between layers typically is one of degree rather than a difference in kind. In one embodiment, the quantity of the at least one component can vary continuously within a first "below threshold" range of values in regions 106a and a second "above threshold" range of values in regions 106b. Alternatively, the quantity of the at least one component can exhibit a more abrupt change, or even a step change, at boundaries between directly adjacent region 106a, 106b.

In a particular embodiment, the varying component can be a concentration of a dopant in the semiconductor region, such that a profile 105 of the dopant concentration relative to depth from the major surface can appear as seen in FIG. 1A. For example, when the semiconductor region includes or consists essentially of silicon, the concentration of a dopant such as arsenic, phosphorus, or boron within the semiconductor region can alternate between a first range of values within first regions 106a, and a second range of values within second regions 106b, wherein one of the first or second ranges reaches a greater concentration of the dopant than the other one of the ranges. Thus, in one example, the concentration of the dopant within the semiconductor region can alternate with depth a plurality of times between a lower value such as below $10^{18}$ cm$^{-3}$ and a higher value such as above $10^{19}$ cm$^{-3}$.

In a particular embodiment, at least a portion of the semiconductor region can be formed by deposition by varying the composition of materials present in a chamber during the deposition. For example, the semiconductor region 106 can be formed by successively epitaxially growing a series of semiconductor regions 106a, 106b by varying a quantity of a dopant supplied to the deposition chamber. A wafer including the semiconductor region can then be joined with a dielectric layer and a SOI layer of a second wafer to form a silicon-on-insulator wafer structure 102 as seen in FIG. 1, and then the pad nitride and oxide layers 110, 110A and hard mask layer 112 can then be formed.

Alternatively, the semiconductor region 106 can be formed by successively depositing a series of polycrystalline semiconductor layers onto a supporting substrate or mandrel, and varying the concentration of the dopant during the deposition to produce a structure as shown in FIG. 1 having alternating regions 106a, 106b of different concentrations of the dopant.

As illustrated in FIG. 2, an opening is now formed which extends through the hard mask 112, pad dielectric 110, the silicon layer 104 and the BOX layer 108 to expose a surface of the bulk semiconductor region 106 underlying the BOX layer. The opening can be formed by any suitable method such as lithography and a directional etch (e.g., reactive ion etch). A dielectric layer 114 can be formed which lines a wall 116 of the opening. In one embodiment, the dielectric layer 114 is formed by depositing silicon nitride onto the wall 116 of the opening and onto an exposed surface 118 of the hard mask layer 112. As seen in FIG. 2, the dielectric layer 114 has walls 120 extending in a vertical direction 125 along the wall 116 of the silicon layer 104 and the dielectric layer has a bottom 122 extending in a direction transverse to the vertical direction.

Figure 3:
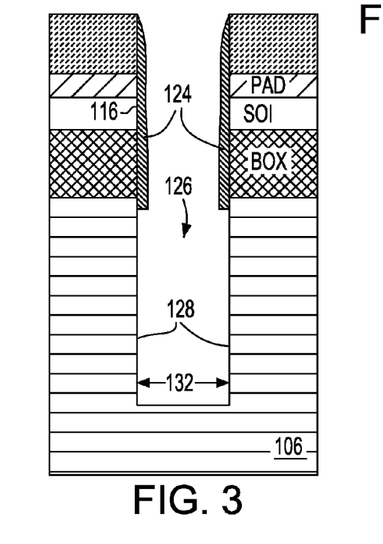
FIGS. 3, 4, 5, 6, 7 and 8 are sectional views illustrating successive stages subsequent to the stage of FIG. 1 in a method of forming an enhanced capacitance trench capacitor in accordance with an embodiment of the invention.

Subsequently, an anisotropic dry etch process, such as a reactive ion etch ("RIE") process which includes ion bombardment, forms an opening extending through the bottom 122 of the dielectric layer 114 and exposing the underlying bulk semiconductor region 106 (FIG. 3). As a result, vertically extending spacers 124 are formed from the remains of the dielectric layer 114 (FIG. 2) along the walls 116. The same RIE process can be continued to remove semiconductor material from the bulk semiconductor region 106 aligned with the opening in the dielectric layer to form a trench 126. After the RIE, the roughness of the interior surface of the trench, i.e., a wall 128 thereof, typically is small, i.e., ranging from less than 1 nanometer to about 2 nanometers root mean square (rms).

Figure 4:
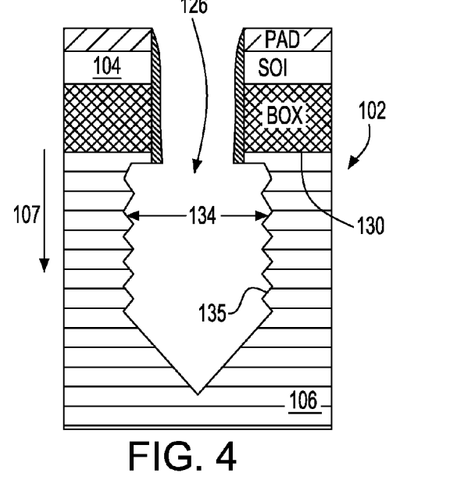

Thereafter, the interior surface 128 of the trench 126 is etched in a manner dependent upon the concentration of a particular dopant present at the interior surface 128 of the trench, which modifies the trench as seen in FIG. 4. To do this, a chemical etchant can be used in a wet etch process, for example. At the conclusion of such etch process, the trench exhibits an interior surface having a series of undulations 135 which follow the variations in the concentration of the particular dopant with the depth 107 from the major surface 130 of the semiconductor region, such that the interior surface 135 undulates with the depth 107 from the major surface 130 a plurality of times. In addition, the etch process can enlarge the trench 126 from an initial lateral dimension 132 (FIG. 3) after the initial RIE etch to a larger lateral dimension 134. The remaining hard mask layer 118, seen in FIG. 2, can be removed at this stage or later.

Alternatively, a trench 126 having an interior surface with undulations 135 as shown and described with respect to FIG. 4 can be formed using an anisotropic (e.g., RIE) etch process in which the etch rate is dependent upon the concentration of the dopant in the semiconductor region 106. In such case, the subsequent wet etch step can be omitted. However, in another example, the subsequent wet etch step can still be performed to further define or enhance the height of the undulations in the interior surface which exist following the anisotropic etch process.

Figure 5:
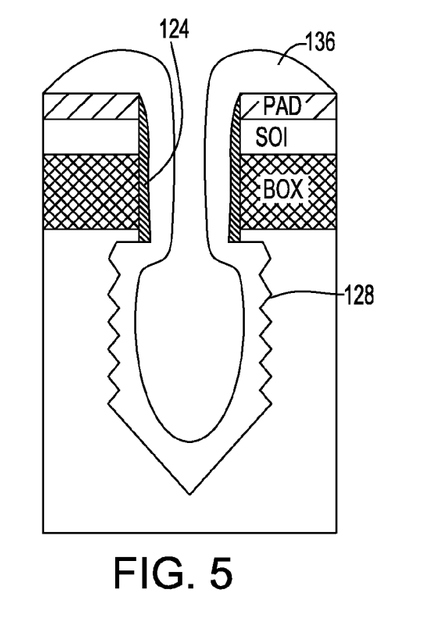
Figure 6:
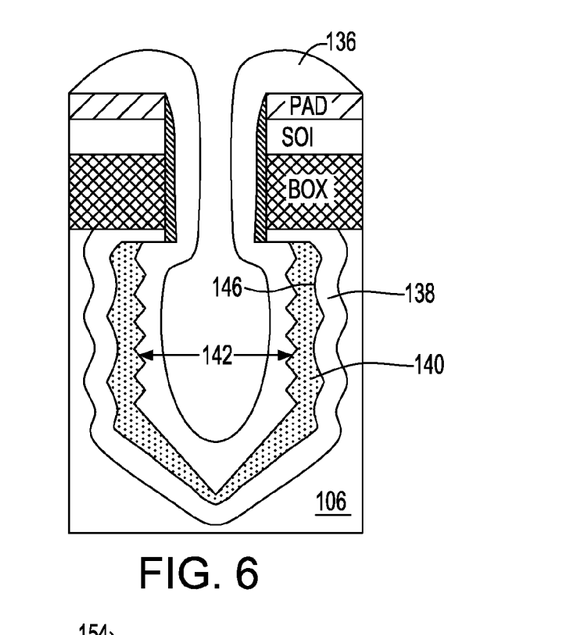

Subsequently, as seen in FIG. 5, a dopant source layer 136 used for forming a buried plate can be formed to overlie the exposed wall 128 and spacer 124. In one example, the dopant source layer can include or consists at least essentially of doped oxide such as arsenic-doped silicate glass ("ASG"). Although the alternating structure of semiconductor regions 106a, 106b, as seen in FIG. 4 is still present in FIGS. 5, 6, 7, 8, 9A and 9B, these illustrative details are omitted from the view shown for ease of reference. As further illustrated in FIG. 6, a dopant drive-in anneal can be performed, in which the substrate with the dopant source layer thereon is heated to a high temperature sufficient to drive the dopant from the dopant source layer 136 into the bulk semiconductor region 106 adjacent thereto. Typically, the temperature is similar to a temperature used to anneal the substrate following an ion implant step. For example, an anneal can be performed at a temperature between about 750 and 1300° C. for a period of time between about 30 seconds and 30 minutes. As a result of such processing, a doped region 138 can be formed in the bulk semiconductor region 106 surrounding the dopant source layer 136 which can serve a buried plate for a trench capacitor. In addition, the drive-in anneal can be performed in an environment containing a source of oxygen such as water vapor. As a result, a portion of the bulk semiconductor region adjacent to dopant source layer 136 typically is oxidized to form an oxidized portion 140.

Because a portion of the bulk semiconductor region is oxidized and consumed during oxidation, the lateral dimension 142 of the trench can be enlarged to an even greater extent than before. Any sharp edges and corners in the walls of the trench prior to the dopant drive in oxidize faster than other relatively flat portions between the edges and corners. As a result, such edges or corners are consumed by oxide and become larger radius edges 146 and corners.

In one variation of such process, the doped region can be formed using gas phase doping, e.g., using arsenic or phosphorus, with application of heat or subsequent application of heat to drive in dopant ions to the desired distance from the interior surface of the trench. The gas phase doping may be performed with or without the simultaneous oxidation of a portion of the semiconductor region adjacent the trench interior surface.

Figure 7:
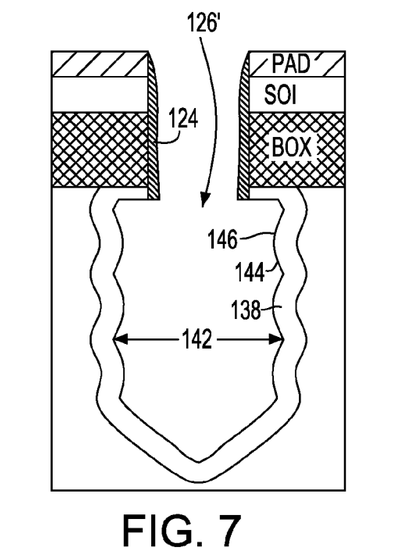

As seen in FIG. 7, a process now is performed to remove the oxidized portion of the semiconductor region 106 from overlying the buried plate doped region 138, and with it, the dopant source layer as well, for example, by a wet etch solution containing hydrofluoric acid. The result is a trench 126' having an enlarged lateral dimension 142 larger than the lateral dimension 134 (FIG. 4) of the trench following the etch process illustrated therein. The interior surface or wall 144 of the trench has an undulating surface due to aforementioned processing, but in which edges between adjacent portions of the surface may have been smoothed into larger radius edges 146.

The smoothed, larger radius edges 146 and corners reduce the electric fields which could have occurred at those locations in the finished capacitor, than if sharper edges had been allowed to remain in the finished capacitor. Once this stage of fabrication is reached, the surface roughness may typically range between about 5 nanometers and 25 nanometers rms. The rounded corners and edges between facets have a radius typically ranging between about 2 nanometers and 10 nanometers.

Figure 8:
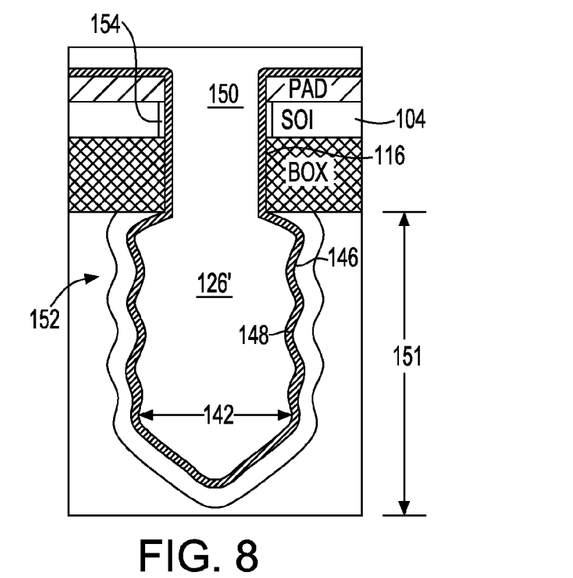

As seen in FIG. 8, steps can be performed to complete the trench capacitor 152. The dielectric spacer 124 (FIG. 7) on the wall 116 of the upper portion of the trench can be stripped and a capacitor dielectric layer or "node dielectric layer" 148 then formed or deposited on the wall 116 and on the rough-surfaced wall 146 in the lower portion of the trench. After stripping the dielectric spacer 124, optionally, an insulating layer such as a dielectric collar 154 can be formed along a wall of the silicon layer 104 to avoid electrical interaction between the trench capacitor 152 and devices within the silicon layer 104. Node dielectric layer 148 may comprise any dielectric material appropriate for forming a trench capacitor, including but not limited to, silicon oxide, silicon nitride, silicon oxynitride, high-k material having a relative permittivity above about 8, or any combination of these materials. Examples of high-k material include but are not limited to hafnium oxide, hafnium silicon oxide, hafnium silicon oxynitride, aluminum oxide, zirconium oxide, and any combination of these materials. The node dielectric layer 148 may be formed by any suitable method, including but not limited to, thermal oxidation, chemical oxidation, thermal nitridation, atomic layer deposition (ALD), molecular layer deposition (MLD), chemical vapor deposition (CVD), low-pressure chemical vapor deposition (LPCVD), and any combination of those methods. The node dielectric layer typically is very thin, having a thickness of up to about 6 nanometers, for example, and typically significantly thinner than 6 nanometers. Typically, the node dielectric layer 148 conforms to the contour of the surface on which it is formed, and thus, will have an exposed surface within the trench which at least substantially conforms to the contour of the undulating interior surface 146 of the trench 126'.

Subsequently, a conductive electrode material 150 such as a doped polycrystalline semiconductor, a metal, a conductive compound of a metal (e.g., tungsten), a conductive metallic compound (e.g., titanium nitride), or a combination thereof can be deposited onto the node dielectric layer to form a node electrode. The node electrode can fill the trench 126' or the node electrode can line the node dielectric layer 148 along the wall 146. The conductive electrode material 150 may be formed by any suitable method, including but not limited to, atomic layer deposition (ALD), chemical vapor deposition (CVD), low-pressure chemical vapor deposition (LPCVD), and any combination of those methods.

Because the capacitor dielectric layer or "node dielectric layer" 148 is formed on a wall 146 of the trench having an undulating interior surface, the wall 146 provides a surface having greater surface area than that of a relatively smooth conventional trench wall. In one example, the surface roughness of the undulating interior surface 146 of the trench can range between about 5 nanometers and 25 nanometers rms. Because the capacitor dielectric layer 148 is formed on a surface 146 having such roughness, the trench capacitor 152 can have significantly greater capacitance than a conventional trench capacitor. For example, a capacitor can be obtained which has a capacitance that is more than ten percent greater than that of a conventional trench capacitor having the same lateral dimension 142 and vertical length 151. In a particular example, the increase in capacitance from the process described herein may be more than double the increase in capacitance that results from only enlarging the size of the trench using a bottle process.

Figure 9A:
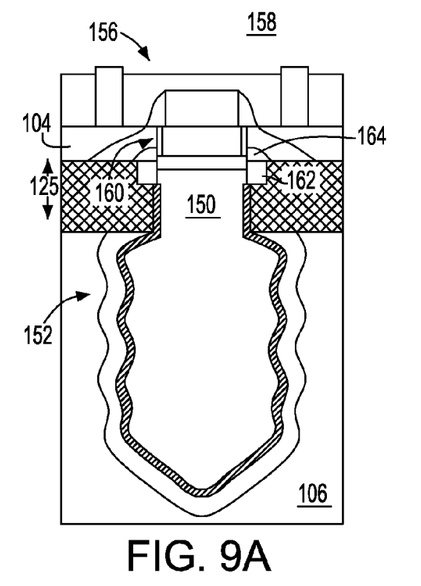
FIG. 9A is a sectional view illustrating a DRAM cell including an enhanced capacitance trench capacitor and a vertical transistor in accordance with an embodiment of the invention.

Alternatively, as illustrated in FIG. 9A, the trench capacitor 152 can be connected to a transistor 156 having an active semiconductor region in the silicon layer 104. In this way, the trench capacitor can function as the capacitor of a dynamic random access memory ("DRAM") cell 158 including the transistor 156 and trench capacitor 152. In the embodiment seen in FIG. 9A, the transistor 156 can have a channel region 160 which is oriented in a vertical direction 125 with respect to the major surface of the semiconductor region 106, the transistor being conductively connected to the node electrode 150 by way of a buried strap 162 and buried strap outdiffusion 164.

Figure 9B:
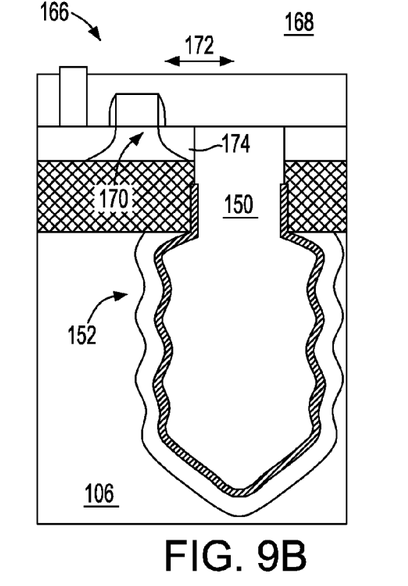
FIG. 9B is a sectional view illustrating a DRAM cell including an enhanced capacitance trench capacitor and a vertical transistor in accordance with an embodiment of the invention.

In another variation, as illustrated in FIG. 9B, the trench capacitor 152 can be connected to a planar transistor 166 of a DRAM cell 168, in which the transistor has a channel region 170 oriented in a horizontal direction 172 with respect to the major surface of the semiconductor region 106. In this case, the transistor can be conductively connected to the node electrode 150 by way of a buried strap outdiffusion 174. The transistors shown in FIGS. 9A-B are merely illustrative of a great variety of transistor structures and DRAM cell designs which can be fabricated to connect with and operate cooperatively with the trench capacitor shown therein.

In one variation of the above-described method, the semiconductor region can include a first semiconductor material and a second semiconductor material which is alloyed with the first semiconductor material in at least some of the regions 106a, 106b (FIG. 1) of the semiconductor region. In one example, the semiconductor region can have a structure which includes some regions being either regions 106a, or 106b, which consist essentially of a first semiconductor material such as silicon, in which others of the regions 106a, or 106b include a second semiconductor material such as germanium which is alloyed with the first semiconductor material—silicon—in silicon germanium regions. In such case, the quantity of the second semiconductor material which is a component of the semiconductor region can alternate with the depth 107 a plurality of times between first quantities in regions 106a and substantially different second quantities in regions 106b. The first quantities are substantially greater than the second quantities, or the second quantities are substantially greater than the first quantities. The lower quantities can be either zero or positive quantities. Thus, in a particular example, regions 106a consist essentially of silicon (Si) and regions 106b which alternate therewith consist essentially of a silicon germanium alloy (SiGe) in a stack of regions which alternate as follows: Si—SiGe—Si—SiGe—Si, etc. A semiconductor region including silicon having such arrangement of alternating layers of higher and lower (or zero) germanium content can be formed by varying components supplied to a chamber when either successively depositing polycrystalline layers of the semiconductor region on a supporting carrier, or alternatively epitaxially growing monocrystalline semiconductor layers on a monocrystalline semiconductor substrate.

In such variation, an anisotropic etch process such as a reactive ion etch process applied to a semiconductor region having the above-described alternating regions of higher and lower quantities of a second semiconductor component, can form a trench having straight walls 128 as shown and described above relative to FIG. 3. Thereafter, a wet etch process selective to silicon etches those of the regions 106a, 106b which have the higher germanium content to a greater extent, and etches the others of the regions 106a, 106b having comparatively low or little germanium content to a comparatively small, insubstantial or insignificant degree. In this way, the wet etch process produces trench 126 (FIG. 4) having an interior surface 135 which undulates with the depth 107 from the major surface 130 a plurality of times.

Figure 11:
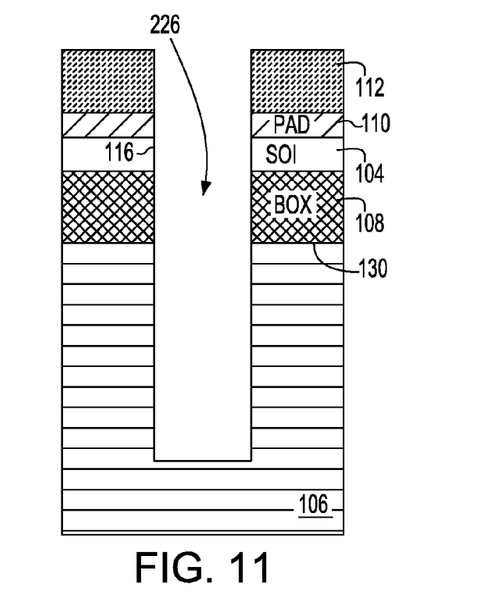
FIG. 11 is a sectional view illustrating a stage in a method of forming an enhanced capacitance trench capacitor in accordance with a variation of an embodiment of the invention.

Referring to FIG. 11, in yet another variation, the step of forming a spacer lining a surface of the SOI layer can be omitted, such that an anisotropic etch process such as a reactive ion etch process can etch through the hard mask layer 112, pad layer(s) 110, SOI layer 104, and BOX layer 108, and etch a trench 226 in the semiconductor region without requiring an intermediate step of stopping the etch process when reaching the semiconductor major surface 130 and without having to form a spacer covering exposed surfaces 116 of the SOI layer, as described above with respect to FIGS. 1 and 2. This result can be achieved because the etch process can be conducted in a way that is selective to regions which consist essentially of silicon, such that the etch process affects the SOI layer 104 only insubstantially if at all. For example, as described above, a subsequent etch process which etches silicon germanium in a way that is selective to silicon can produce a trench having an undulating interior surface, without requiring the SOI layer 104 to be protected by a spacer, e.g., a dielectric layer thereon, as described above (FIGS. 2-3).

Figure 10:
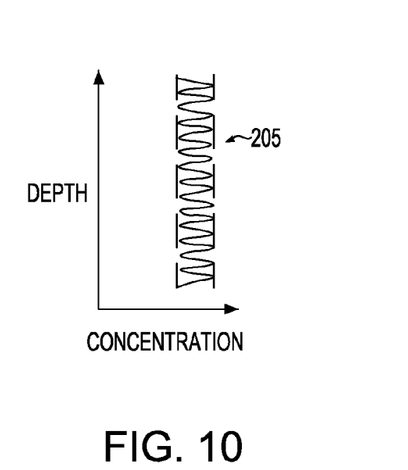
FIG. 10 is a graph illustrating a profile of a dopant concentration in accordance with a depth from a major surface of a semiconductor region in a method of forming an enhanced capacitance trench capacitor according to a variation of an embodiment of the invention.

With reference to FIG. 10, in another variation of the above-described method, the concentration of an n-type dopant, e.g., arsenic or phosphorus, in the semiconductor region 106 can be sufficiently high before applying the steps (FIGS. 2-3) to begin etching trench in the semiconductor region as described above. In this case, the concentration of a dopant such as arsenic, phosphorus or boron used to increase charge carriers within the semiconductor region can be provided at a level between about $10^{17}$ cm$^{-3}$ to about $10^{21}$ cm$^{-3}$. As further seen in FIG. 10, and as in the above-described embodiment, the concentration of such dopant can alternate with depth a plurality of times between at least two different values. Thus, in one example, within the semiconductor region, the concentration of the dopant can alternate with depth a plurality of times between a lower value such as about $10^{18}$ cm$^{-3}$ and a higher value such as about $10^{20}$ cm$^{-3}$. In this way, once the trench is formed, e.g., by any of the variations of the processing described above with respect to FIGS. 3 and 4, further processing described above with respect to FIGS. 5-7 for forming a buried plate can be omitted.

Figure 12:
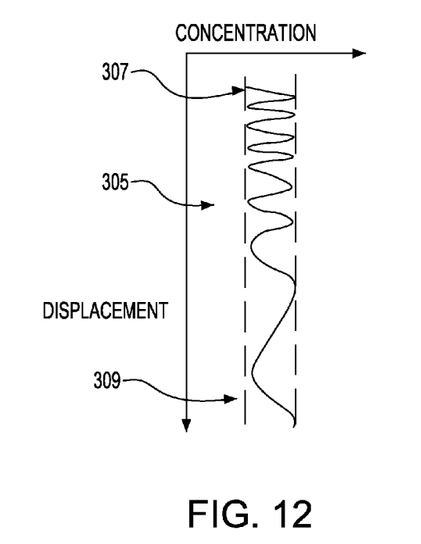
FIG. 12 is a graph illustrating a profile of a dopant concentration in accordance with displacement from a major surface of a semiconductor region in a method of forming an enhanced capacitance trench capacitor according to another variation of an embodiment of the invention.
Figure 13:
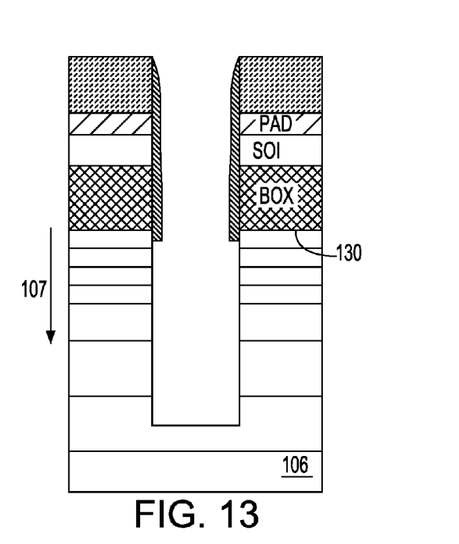
FIG. 13 is a sectional view illustrating a stage in a method of forming an enhanced capacitance trench capacitor in accordance with another variation of an embodiment of the invention.

Referring to FIGS. 12-13, in yet another variation of any or all of the above-described embodiments, the concentration of the dopant within the semiconductor region, e.g., arsenic, phosphorus, or boron, can have different rates of change in accordance with displacement 107 from the major surface 130 of the semiconductor region. Specifically, as shown in FIGS. 12-13, the rate of the change of the dopant concentration can slow down with increasing depth from the major surface. FIG. 12 shows that the greater the displacement becomes in the negative (downward) direction from the major surface, the more spread out the alternations of the dopant concentration become. In this way, near the major surface 130 the dopant concentration 307 can have a first rate of change, and can have a second rate of change 309 farther from the major surface 130, i.e., closer to the bottom of the trench. Typically, the first rate of change is substantially greater than the second rate of change. In one example, a dopant profile 305 in which the dopant concentration has a substantially higher rate of change 307 at some depth, e.g., near the major surface, can be achieved by implanting dopant ions to alter the dopant profile of a semiconductor region which before the ion implantation has an essentially constant and uniform dopant profile. In another example, the dopant profile 305 can be achieved by implanting dopant ions into a semiconductor region which already has a dopant profile in which the concentration of the dopant varies with the depth 107 from the major surface. For example, dopant ions can be implanted into a semiconductor region 106 which has a dopant profile 105 which alternates with the depth 107 from the major surface such as the dopant profile 105 illustrated in FIG. 1A, but in which the initial rate of change of the dopant concentration with depth can be relatively low. The dopant implantation step can then increase the rate of change of the dopant concentration in the semiconductor region near the major surface 130 as seen at 307 to produce the dopant profile 305 illustrated in FIG. 12.

In a further variation of the above-described embodiments, the SOI layer and the BOX layer can be omitted from the starting structure. In that case, the starting structure (FIG. 14) can be a monolithic bulk semiconductor region 202 having a pad layer 210 and hard mask layer 212 overlying the major surface 230. As further shown in FIG. 14, the alternating semiconductor regions 206a, 206b can have alternating different concentrations of a dopant, as described above. In another variation, the semiconductor region 206 can alternate between first regions having higher quantities (i.e., weight percentages) of a second semiconductor material, e.g., germanium, alloyed with a first semiconductor material, e.g., silicon, and second regions having zero or relatively low quantities (i.e., weight percentages) of the second semiconductor material. In still another variation, the semiconductor region can have both alternating concentrations of the dopant and alternating quantities of the second semiconductor material therein. The different semiconductor regions 206a, 206b can be arranged so that the dopant concentrations or the quantities of the second semiconductor material alternate with depth 207 from a level 232 within the substrate which will coincide with an upper boundary 234 (FIG. 16) of the trench 236 to be formed therein.

Figure 15:
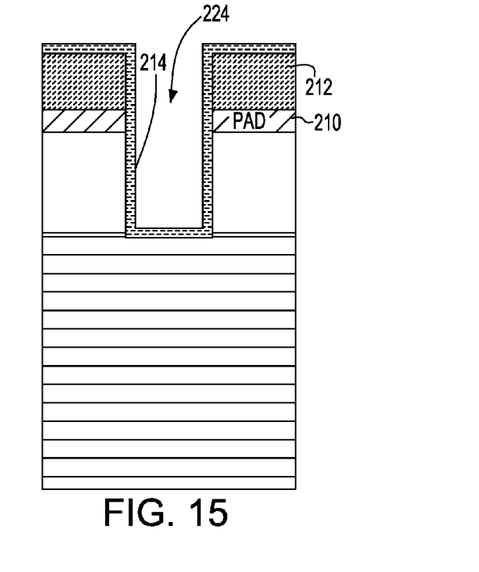
Figure 16:
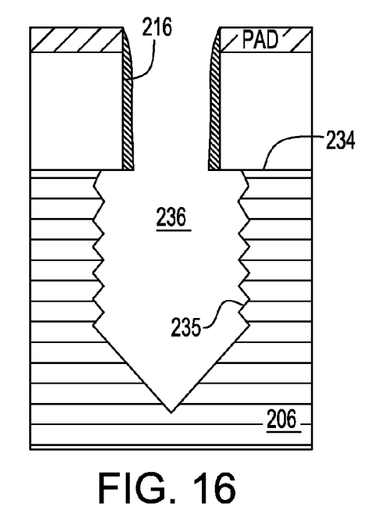
Figure 17:
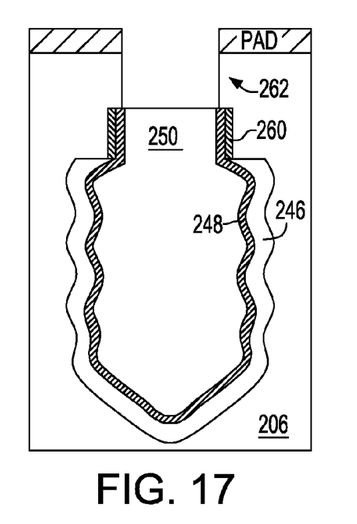

As illustrated in FIG. 15, an opening 224 is formed in the hard mask layer 212 and underlying pad dielectric layer 210, upon a wall of which a dielectric layer 214 then is formed. Except for the lack of a BOX layer and an overlying monocrystalline silicon layer in the substrate overlying the bulk semiconductor region 206, the subsequent series of processing steps illustrated with reference to FIGS. 16 and 17 are the same as those described above with reference to FIGS. 3-8. Thus, a trench 236 (FIG. 16) extends from an upper boundary 234 which can be at the same level from which the alternating semiconductor regions 206a, 206b begin. The upper boundary of the trench 236 can be disposed at a lower edge 218 of a dielectric spacer 216 formed from dielectric layer 214.

Figure 14:
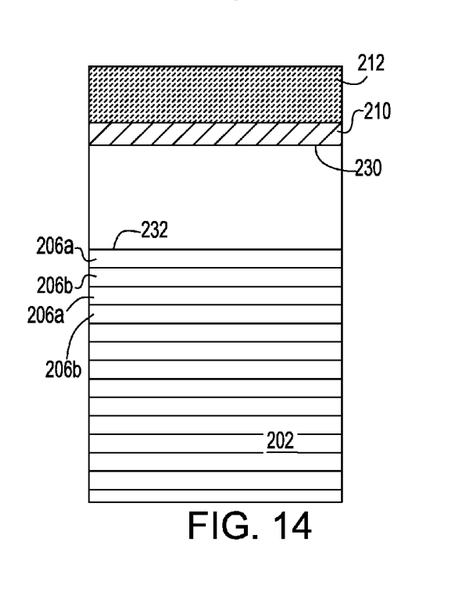
FIGS. 14, 15, 16, and 17 are sectional views illustrating successive stages in a method of forming an enhanced capacitance trench capacitor in accordance with a variation of an embodiment of the invention.

FIG. 17 illustrates a further stage of fabrication after a buried plate 246 has been formed in the semiconductor region, as well as the collar 260, capacitor dielectric layer 248 and a node electrode 250 have been formed, such as in accordance with one or more of the embodiments or variations thereof which are described above. Although the alternating structure of semiconductor regions 206a, 206b, as seen in FIG. 14 is still present in FIGS. 17, 18 and 19, these illustrative details are omitted from the view shown for ease of reference.

Figures 18, 19:
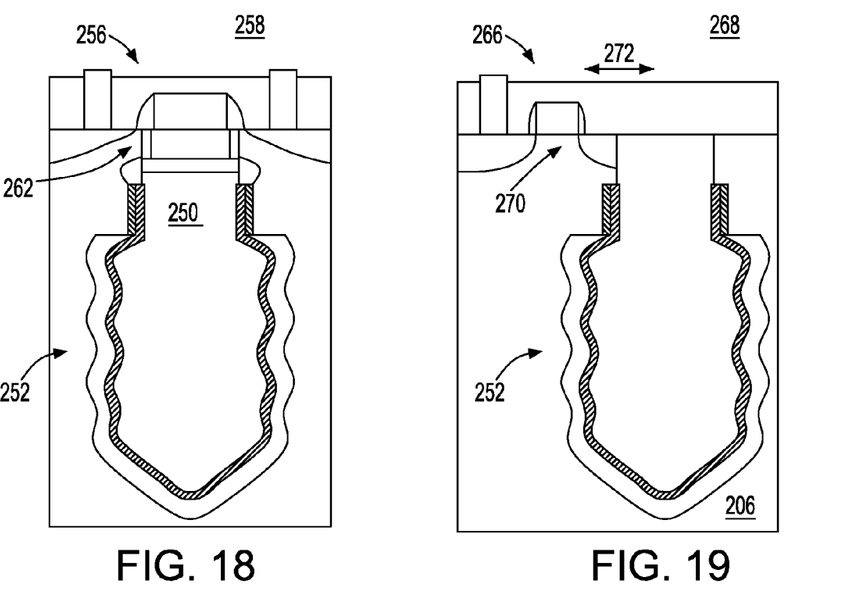
FIG. 18 is a sectional view illustrating a DRAM cell including an enhanced capacitance trench capacitor and a vertical transistor in accordance with an embodiment of the invention.
FIG. 19 is a sectional view illustrating a DRAM cell including an enhanced capacitance trench capacitor and a planar transistor in accordance with an embodiment of the invention.

Subsequently, as illustrated in FIG. 18, a transistor 256 can be formed which has a vertically-oriented channel region in the transistor region 262 of the substrate and having a conductive connection to the node electrode 250 of the trench capacitor. Again, the trench capacitor can function as the capacitor of a dynamic random access memory ("DRAM") cell 258 including the transistor 256 and trench capacitor 252.

In another variation, as illustrated in FIG. 19, the trench capacitor 252 can be connected to a planar transistor 266 of a DRAM cell 268, in which the transistor has a channel region 270 oriented in a horizontal direction 272 with respect to the major surface of the semiconductor region 206. The transistors shown in FIGS. 18-19 are merely illustrative of a great variety of transistor structures and DRAM cell designs which can be fabricated to connect with and operate cooperatively with the trench capacitor shown therein.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of fabricating a trench capacitor, comprising:
   a) forming a semiconductor region of a substrate by successively depositing layers of semiconductor material including silicon in which a quantity of germanium in the layers alternates a plurality of times between at least two different values such that the quantity of germanium in the semiconductor region alternates with depth a plurality of times between the at least two different values;
   b) etching the semiconductor region in a manner dependent upon the quantity of germanium to form a trench having an interior surface which undulates with depth from a major surface of the semiconductor region; and
   c) forming a trench capacitor having an undulating capacitor dielectric layer, the undulations of the capacitor dielectric layer being at least partly determined by the undulating interior surface of the trench.

2. The method as claimed in claim 1, wherein the undulations of the capacitor dielectric layer conform to the undulating interior surface of the trench.

3. The method as claimed in claim 1, wherein step (c) further comprises etching material exposed at the undulating interior surface of the trench to increase an interior volume of the trench before forming the capacitor dielectric layer.

4. The method as claimed in claim 1, further comprising forming at least one transistor, the transistor having at least a portion within the substrate electrically connected with the trench capacitor.

5. The method as claimed in claim 1, wherein step (a) includes successively depositing monocrystalline layers of the semiconductor material by epitaxially growing the layers.

6. The method as claimed in claim 1, wherein step (a) includes successively depositing polycrystalline layers of the semiconductor material.

7. A method of fabricating a trench capacitor, comprising:
   a) etching a semiconductor region of a substrate, the semiconductor region having a concentration of a dopant therein which alternates with depth a plurality of times between at least two different values, each of the at least two different values being between about $10^{17}$ cm$^{-3}$ and about $10^{21}$ cm$^{-3}$, the dopant being used to increase a number of charge carriers within the semiconductor region and being selected from arsenic, phosphorus and boron, the etching being performed in a manner dependent upon the dopant concentration to form a trench having an interior surface which undulates with depth from a major surface of the semiconductor region; and
   b) forming a trench capacitor having an undulating capacitor dielectric layer, the undulations of the capacitor dielectric layer being at least partly determined by the undulating interior surface of the trench.

8. The method as claimed in claim 7, wherein the substrate includes a dielectric layer and a monocrystalline silicon-on-insulator ("SOI") layer separated from the semiconductor region by the dielectric layer, the method further comprising forming a spacer at least lining an opening in the SOI layer, the spacer protecting the SOI layer when performing at least the etching of the semiconductor region in a manner dependent upon the material composition of the semiconductor region.

9. The method as claimed in claim 7, wherein the dopant concentration in the semiconductor region at the time of performing step (a) is insufficient to serve as a buried plate, and step (b) includes increasing the dopant concentration in the semiconductor region adjacent to the undulating surface to form a buried plate of the trench capacitor before forming the capacitor dielectric layer.

10. The method as claimed in claim 7, wherein prior to performing step (a) a dopant concentration in at least a portion of the semiconductor region is suitable for serving as a plate of the trench capacitor, and step (a) is performed in a manner which exposes the at least a portion having the suitable dopant concentration at the undulating surface.

11. The method as claimed in claim 7, wherein a rate of change with depth of the dopant concentration in the semiconductor region varies between a first rate with depth at positions adjacent a major surface of the semiconductor region and a second substantially lower rate at positions of greater depths from the major surface, such that the undulating interior surface of the trench undulates at a greater rate adjacent the major surface than at depths farther from the major surface.

12. The method as claimed in claim 7, wherein prior to performing step (a) a dopant concentration in at least a portion of the semiconductor region is suitable for serving as a plate of the trench capacitor, step (a) is performed in a manner which exposes the at least a portion having the suitable dopant concentration at the undulating surface.

13. The method as claimed in claim 12, wherein step (b) includes forming the trench capacitor with the at least a portion of the semiconductor region serving as a plate of the trench capacitor.

14. The method as claimed in claim 7, wherein step (b) further comprises etching material exposed at the undulating interior surface of the trench to increase an interior volume of the trench before forming the capacitor dielectric layer.

15. The method as claimed in claim 7, further comprising forming at least one transistor, the transistor having at least a portion within the substrate electrically connected with the trench capacitor.

* * * * *